(12) United States Patent
Isaacs et al.

(10) Patent No.: US 11,404,287 B2
(45) Date of Patent: Aug. 2, 2022

(54) FIXTURE FACILITATING HEAT SINK FABRICATION

(71) Applicant: INTERNATIONAL BUSINESS MACHINES CORPORATION, Armonk, NY (US)

(72) Inventors: Phillip D. Isaacs, Rochester, MN (US); Christopher M. Marroquin, Rochester, MN (US); Daren Simmons, Poughkeepsie, NY (US); Frank L. Pompeo, Redding, CT (US); Jason R. Eagle, Mantorville, MN (US); Mark K. Hoffmeyer, Rochester, MN (US); Michael J. Ellsworth, Jr., Lagrangeville, NY (US); Prabjit Singh, Poughkeepsie, NY (US); Steve Ostrander, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 35 days.

(21) Appl. No.: 17/130,041

(22) Filed: Dec. 22, 2020

(65) Prior Publication Data

US 2021/0111037 A1    Apr. 15, 2021

Related U.S. Application Data

(62) Division of application No. 15/899,661, filed on Feb. 20, 2018, now Pat. No. 10,978,313.

(51) Int. Cl.
*H01L 21/48*        (2006.01)
*H01L 23/367*       (2006.01)
(Continued)

(52) U.S. Cl.
CPC ........ *H01L 21/4882* (2013.01); *B21D 53/022* (2013.01); *H01L 23/3677* (2013.01);
(Continued)

(58) Field of Classification Search
CPC . H01L 21/4882; H01L 23/3677; H01L 23/40; H01L 23/473; H01L 23/3672;
(Continued)

(56) References Cited

U.S. PATENT DOCUMENTS 3,226,466 A * 12/1965 Martin ................. H01L 25/117
                                                                        257/E23.083
3,689,334 A *  9/1972 Dermody ............ C09J 133/062
                                                                        156/332
(Continued)

FOREIGN PATENT DOCUMENTS

EP          2372759 B1    7/2011
KR    1020050013403 A    2/2005

OTHER PUBLICATIONS

Gillian & Co, "CB14: Brazed Plate Heat Exchanger," Product Brochure, www.gillian.com, Sep. 2007 (2 pages).
(Continued)

*Primary Examiner* — Christopher J Besler
*Assistant Examiner* — Christine Bersabal
(74) *Attorney, Agent, or Firm* — Tihon Poltavets, Esq.; Kevin P. Radigan, Esq.; Heslin Rothenberg Farley & Mesiti P.C.

(57) ABSTRACT

A fixture to facilitate fabrication of a heat sink includes a base plate to support a lower section of the heat sink, and multiple registration pins extending from the base plate. A platen is provided over a heat transfer element (HTE) of the heat sink, with the platen including slip fit regions to slip fit around respective registration pins, and with the lower section and HTE disposed between the base plate and the
(Continued)

platen, and forming a fixture stack segment aligned with an active region of the cold plate. A load plate is provided which includes slip fit regions configured to slip fit around corresponding registration pins with the load plate disposed over the fixture stack segment. The load plate includes a single load pin centrally disposed to apply a load to the fixture stack segment and facilitate bonding the lower section and HTE together.

16 Claims, 10 Drawing Sheets

(51) Int. Cl.
*H01L 23/40* (2006.01)
*H05K 7/20* (2006.01)
*B21D 53/02* (2006.01)
*H01L 23/473* (2006.01)

(52) U.S. Cl.
CPC ............ *H01L 23/40* (2013.01); *H01L 23/473* (2013.01); *H05K 7/20254* (2013.01); *H05K 7/20509* (2013.01); *H01L 23/3672* (2013.01); *H01L 23/4006* (2013.01)

(58) Field of Classification Search
CPC ............ H01L 23/4006; H05K 7/20254; H05K 7/20509; B21D 53/022; F28F 2280/06; F28F 2280/10; F28F 2280/108
USPC ...................................... 269/266, 291, 289 R
See application file for complete search history.

(56) References Cited

U.S. PATENT DOCUMENTS

| | | | |
|---|---|---|---|
| 5,296,739 A | 3/1994 | Hailbronner et al. | |
| 5,981,310 A | 11/1999 | DiGiacomo et al. | |
| 6,065,208 A | 5/2000 | Lamb et al. | |
| 7,063,127 B2 | 6/2006 | Gelorme et al. | |
| 7,508,676 B1 | 3/2009 | Samaniego et al. | |
| 7,629,684 B2 | 12/2009 | Alcoe et al. | |
| 7,849,914 B2 | 12/2010 | Di Stefano et al. | |
| 7,872,344 B2 | 1/2011 | Fjelstad et al. | |
| 8,069,907 B2 | 12/2011 | Bryant et al. | |
| 8,176,972 B2 | 5/2012 | Mok | |
| 8,338,925 B2 | 12/2012 | Fjelstad et al. | |
| 8,736,048 B2 | 5/2014 | Schultz | |
| 8,763,680 B2 | 7/2014 | Bisges et al. | |
| 8,779,578 B2 | 7/2014 | Leigh et al. | |
| 9,570,373 B1 | 2/2017 | Schultz et al. | |
| 9,618,678 B1 | 4/2017 | Tickner et al. | |
| 9,894,801 B1 | 1/2018 | Marroquin et al. | |
| 10,433,463 B2 | 10/2019 | Prest et al. | |
| 2005/0127500 A1 | 6/2005 | Colgan et al. | |
| 2005/0128705 A1 | 6/2005 | Chu et al. | |
| 2005/0252951 A1* | 11/2005 | Liao | B23K 35/02 228/245 |
| 2007/0278669 A1* | 12/2007 | Hierholzer | H01L 25/072 257/E23.084 |
| 2008/0245506 A1 | 10/2008 | Campbell et al. | |
| 2010/0065256 A1 | 3/2010 | Wilcoxon et al. | |
| 2010/0296249 A1 | 11/2010 | Li | |
| 2013/0027870 A1 | 1/2013 | Goldrian et al. | |
| 2013/0199767 A1 | 8/2013 | Karidis et al. | |
| 2016/0290728 A1* | 10/2016 | Coteus | H05K 7/20254 |
| 2018/0154437 A1 | 6/2018 | Mark | |
| 2018/0328675 A1* | 11/2018 | Jo | F28F 9/12 |
| 2019/0259632 A1 | 8/2019 | Isaacs et al. | |

OTHER PUBLICATIONS

Isaacs et al., "List of IBM Patents and/or Patent Applications Treated as Related", U.S. Appl. No. 17/130,041, filed Dec. 22, 2022, dated Dec. 22, 2022 (2 pages).

* cited by examiner

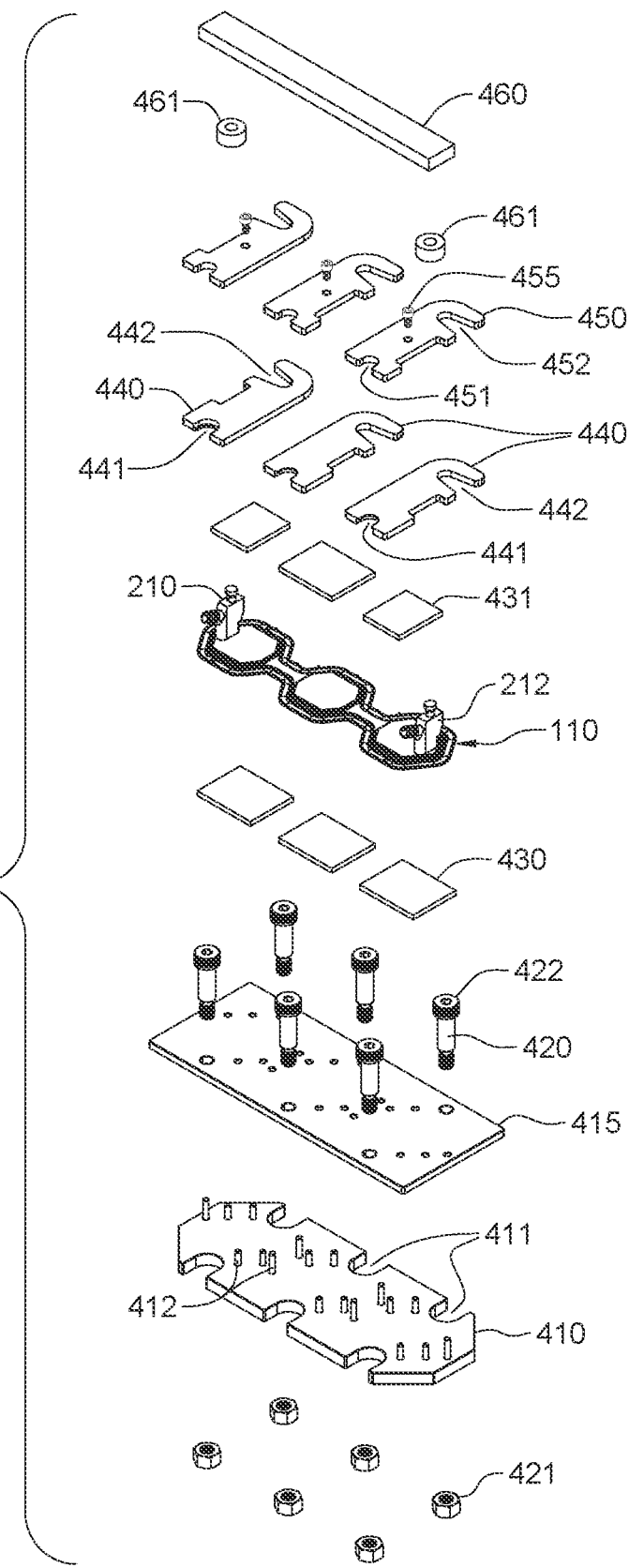

FIXTURE FACILITATING HEAT SINK FABRICATION

BACKGROUND

The power dissipation of integrated circuit chips, and the modules containing the chips, continues to increase in order to achieve continuing increases in processor performance. This trend poses a cooling challenge at both the module and system levels. With ever increasing heat dissipation from electronic devices, and continuing reduction in overall form factor, thermal management remains an important element in electronic product design. Performance reliability and life expectancy of electronic components, such as integrated circuit chips, are inversely related to the component operating temperature.

Heat sinks function by dissipating thermal energy or heat generated by a component, such as an electronic component, into a cooler ambient, for instance, air passing across the heat sink, and transfer thermal energy from the component at a higher temperature to the air at a lower temperature, which typically has a significantly greater heat capacity.

In one design of a heat sink, a metal plate having a flat surface may be provided with an array of comb or fin-like protrusions to increase the heat sink's surface area contacting an airflow as the air passes across the heat sink, which increases the heat dissipation rate. A high thermal conductivity of the heat sink combined with a large surface area provided by such fin-like structures may result in rapid transfer of thermal energy to surrounding, cooler air.

More aggressive liquid-cooled heat sinks (or cold plates) may be required to actively cool certain high-heat generating electronic components, such as integrated circuit chips. In a liquid-cooled cold plate implementation, a coolant, such as water, is provided to flow through the cold plate and extract heat conducted to the cold plate from one or more heat-generating electronic components.

SUMMARY

In one or more aspects, a fixture is provided herein to facilitate fabrication of a cold plate with multiple heat transfer elements. The fixture includes a base plate to support a lower section of the cold plate, with the cold plate including multiple active regions. Each active region is to include a respective heat transfer element to facilitate cooling a respective heat generating electronic component. The fixture further includes multiple registration pins extending from the base plate, and multiple platens to reside over an upper section of the cold plate. A platen of the multiple platens includes slip fit regions configured to slip fit around respective registration pins of the multiple registration pins with the lower section and the upper section of the cold plate disposed between the base plate and the platen, and forming a fixture stack segment aligned with the heat transfer element in a respective active region of the multiple active regions of the cold plate. The fixture further includes multiple load plates. A load plate of the multiple load plates includes slip fit regions configured to slip fit around corresponding registration pins of the multiple registration pins with the load plate disposed over the fixture stack segment, above the platen of the multiple platens, and the load plate including a single load pin. The single load pin in the load plate is centrally disposed in the load plate to facilitate applying a load to the fixture stack segment to facilitating bonding the lower section, the respective heat transfer element and the upper section of the cold plate together.

In another aspect, a method of facilitating fabrication of a cold plate with multiple heat transfer elements is provided. The method includes assembling a fixture, including providing a base plate to support a lower section of the cold plate, the cold plate including multiple active regions, each active region including a respective heat transfer element to facilitate cooling a respective heat-generating electronic component; and positioning multiple registration pins to extend from the base plate. Further, assembling the fixture includes slip fitting multiple platens to reside above an upper section of the cold plate, a platen of the multiple platens including slip fit regions configured to slip fit around respective registration pins of the multiple registration pins, with the lower section and the upper section of the cold plate disposed between the base plate and the platen, and forming a fixture stack segment aligned with a heat transfer element in a respective active region of the multiple active regions of the cold plate. Further, the method includes slip fitting multiple load plates, where a load plate of the multiple load plates includes slip fit regions configured to slip fit around corresponding registration pins of the multiple registration pins, with the load plate disposed over the fixture stack segment, above the platen of the multiple platens, and the load plate including a single load pin. The single load pin of the load plate is centrally disposed in the load plate to facilitate applying a load to the fixture stack segment to facilitate bonding the lower section, the respective heat transfer element and the upper section of the cold plate together.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 4B is an exploded view of the fixture of FIG. 4A, in accordance with one or more aspects of the present invention;

DETAILED DESCRIPTION

Aspects of the present invention and certain features, advantages and details thereof, are explained more fully below with reference to the non-limiting example(s) illustrated in the accompanying drawings. Descriptions of well-known systems, devices, processing techniques, etc., are omitted so as to not unnecessarily obscure the invention in detail. It should be understood, however, that the detailed description in this specific example(s), while indicating aspects of the invention, is given by way of illustration only, and not by way of limitation. Various substitutions, modifications, additions, and/or arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application, for instance, to facilitate fabricating a particular heat sink, such as a flexible cold plate with multiple active regions.

As noted, this disclosure relates to fixtures and fabrication processes for fabricating heat sinks used for cooling electronic components, and in particular, to fixtures for fabricating flexible thin-walled cold plates. Before discussing the fixtures and fabrication processes in detail, an exemplary flexible cold plate and cooled electronic assembly are described below with reference to FIGS. 1-3.

Figure 1:
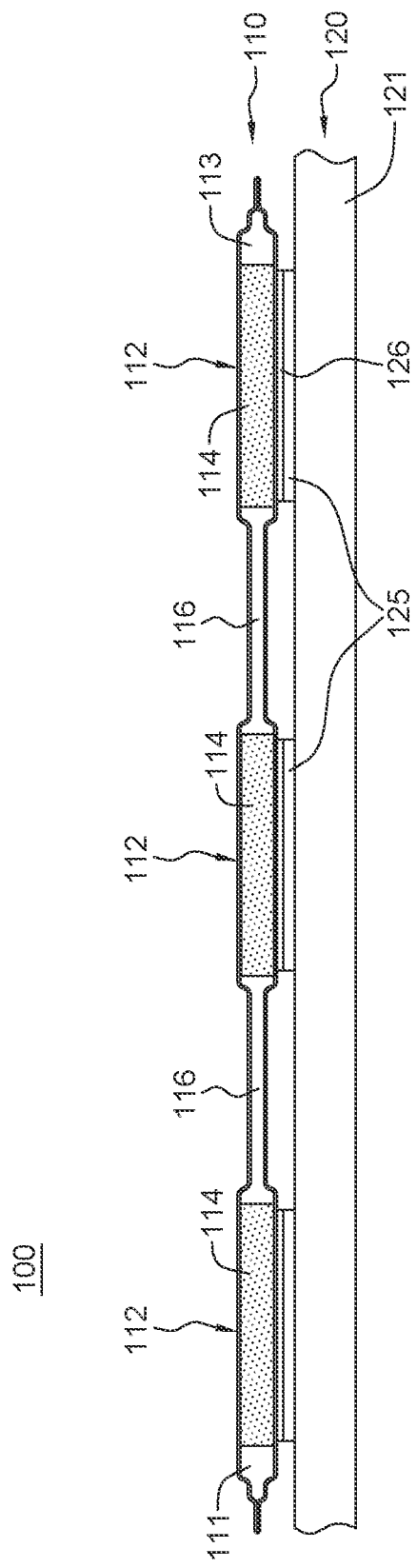
FIG. 1 is a cross-sectional elevational view of one embodiment of a heat sink (configured as a flexible cold plate) coupled to an electronic assembly with three heat generating electronic components to be cooled, the heat sink or flexible cold plate being configured with enhanced flexibility, and to be fabricated in accordance with one or more aspects of the present invention.

FIG. 1 depicts one embodiment of a cooled electronic assembly 100, which includes, in the depicted embodiment, a liquid-cooled cold plate 110 and an electronic assembly 120 that together form cooled electronic assembly 100. By way of example only, electronic assembly 120 includes three heat-generating electronic components 125 to be actively cooled via liquid-cooled cold plate 110. Liquid-cooled cold plate 110 correspondingly includes three active regions 112 (i.e., thermally functional regions dissipating heat), each positioned, sized and configured to couple to (and overlay) a respective heat-generating electronic component 125 of electronic assembly 120. The active regions 112 of liquid-cooled cold plate 110 are physically coupled to heat-generating electronic components 125 via respective thermal interface material (TIM) 126 contacts. The thermal interface material 126 is selected to facilitate conduction of heat from the heat-generating electronic components 125 to the respective active region 112 of liquid-cooled cold plate 110 when in operation.

In the implementation depicted, each active region 112 includes a heat transfer element 114, which may have any of a variety of configurations to facilitate transfer of heat conducted from the respective heat-generating electronic component 125 to coolant (not shown) flowing through liquid-cooled cold plate 110. For instance, heat transfer element 114 in each active region may be a finsink structure comprising a plurality of coolant flow channels through which liquid coolant flows from, for instance, an inlet plenum 111 to an outlet plenum 113 of liquid-cooled cold plate 110 when operational. Note also that a variety of liquid coolants may be used within liquid-cooled cold plate 110, with water or an aqueous-based solution being two examples only.

Liquid-cooled cold plate 110 and heat transfer elements 114 may be fabricated of any of a variety of thermally conductive materials. In one embodiment, liquid-cooled cold plate 110 includes lower and upper thin-walled sheets or plate members, referred to herein as lower and upper sections or shells, which are bonded together along a periphery. In one or more implementations, the thin-walled sheets may be formed of a metal heat sink material, such as copper, aluminum, zinc, stainless steel, etc., and have a thickness ranging from, for instance, 0.5 mm to 1.5 mm, and that is suitable for cooling an electronic component, such as an integrated circuit chip, graphics processor chip, etc., or that is configured to cool an electronic assembly or module. Additionally, heat transfer elements 114 may be formed of a same or different metal heat sink material than the shells, such as copper, aluminum, zinc, stainless steel, etc., and have any desired size and configuration.

In one or more embodiments, liquid-cooled cold plate 110 formed as a 'flexible' cold plate by incorporating lateral compliance into a vertically flexible or compliant cold plate, which allows strain to be absorbed by the cold plate rather than by, for instance, thermal interface material (TIM) 126 providing the interface between the heat-generating electronic components 125 and the corresponding active regions 112 of liquid-cooled cold plate 110. In FIG. 1, the vertically flexible, or compliant, cold plate is shown secured in heat exchange relation with the heat-generating electronic components 125 mounted on a substrate 121 of electronic assembly 120. As shown, heat transfer elements 114 are mounted within liquid-cooled cold plate 110 between the lower and upper sections or shells. In one or more implementations, the heat transfer elements 114 may include fins, pins or other heat transfer structures and may be metallurgically joined, such as brazed or welded, for instance, to the lower section of the liquid-cooled cold plate, as well as to the upper section of the liquid-cooled cold plate.

The thin-walled upper and lower sections or shells of liquid-cooled cold plate 110 provide flexibility to accommodate, for instance, different level electronic components (e.g., chips) within electronic assembly 120. Lateral compliance features such as bends may also be added to allow for lateral expansion and contraction of liquid-cooled cold plate 110 relative to the substrate, without moving or significantly stressing the individual thermal interface material 126 regions or contacts between heat-generating electronic components 125 and active regions 112 of liquid-cooled cold plate 110. In one or more implementations, liquid-cooled cold plate 110 may provide lateral compliance features that minimize or eliminate sheer stress and sheer strain developed in the horizontal direction at the interface between the cold plate and the thermal interface material 126 by allowing for horizontal expansion and contraction of the liquid-cooled cold plate 110 relative to the underlying electronic assembly 120 without moving or otherwise stressing the individual thermal interface material regions in the horizontal direction.

In the embodiment of FIG. 1, stiffness of the cold plate wall may be further reduced by providing reduced height wall sections between active regions 112 of liquid-cooled cold plate 110. More particularly, as depicted in the example of FIG. 1, the height of the cold plate in the active regions 112 may be greater than the height of the cold plate in the intermediate regions 116, between active regions 112. The greater height in the active regions 112 facilitates accommodating the heat transfer elements 114, such as the noted finsinks, in the active regions 112, while the reduced height in the intermediate regions 116 enhances flexibility of the cold plate.

Figure 2A:
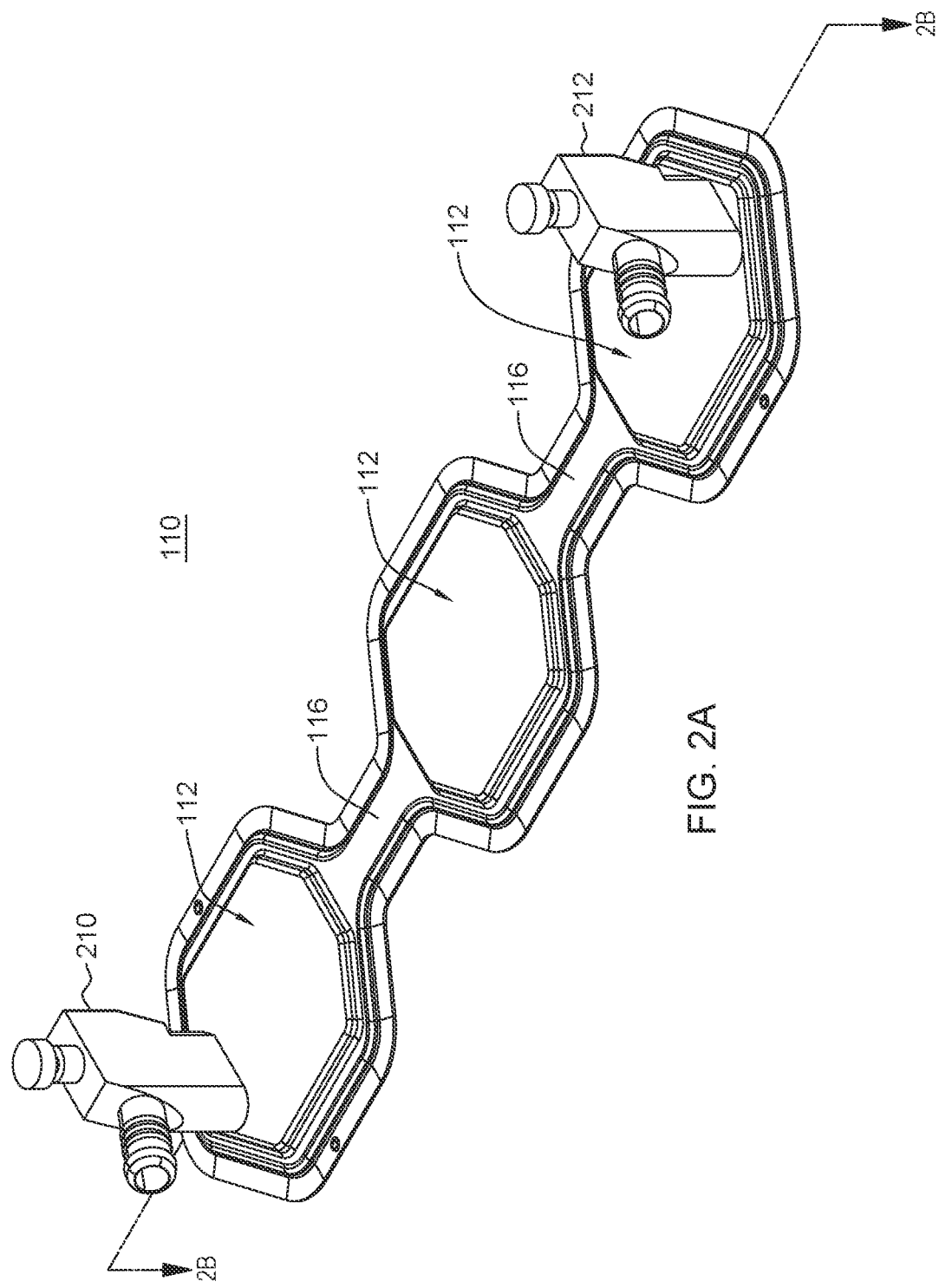
FIG. 2A depicts an assembled view of one embodiment of a flexible cold plate such as depicted in FIG. 1, with multiple active regions, and that is to be fabricated in accordance with one or more aspects of the present invention.

FIG. 2A illustrates liquid-cooled cold plate 110 of FIG. 1, with a raised coolant inlet coupling 210 and a raised coolant outlet coupling 212 extending from the upper section of liquid-cooled cold plate 110. In operation, a coolant loop (not shown) may be coupled to liquid-cooled cold plate 110 via a coolant supply line (not shown) being coupled in fluid communication with raised coolant inlet coupling 210 and a coolant return line (not shown) being coupled in fluid communication with raised coolant outlet coupling 212, which together to facilitate flow of liquid coolant through liquid-cooled cold plate 110.

Figure 2B:
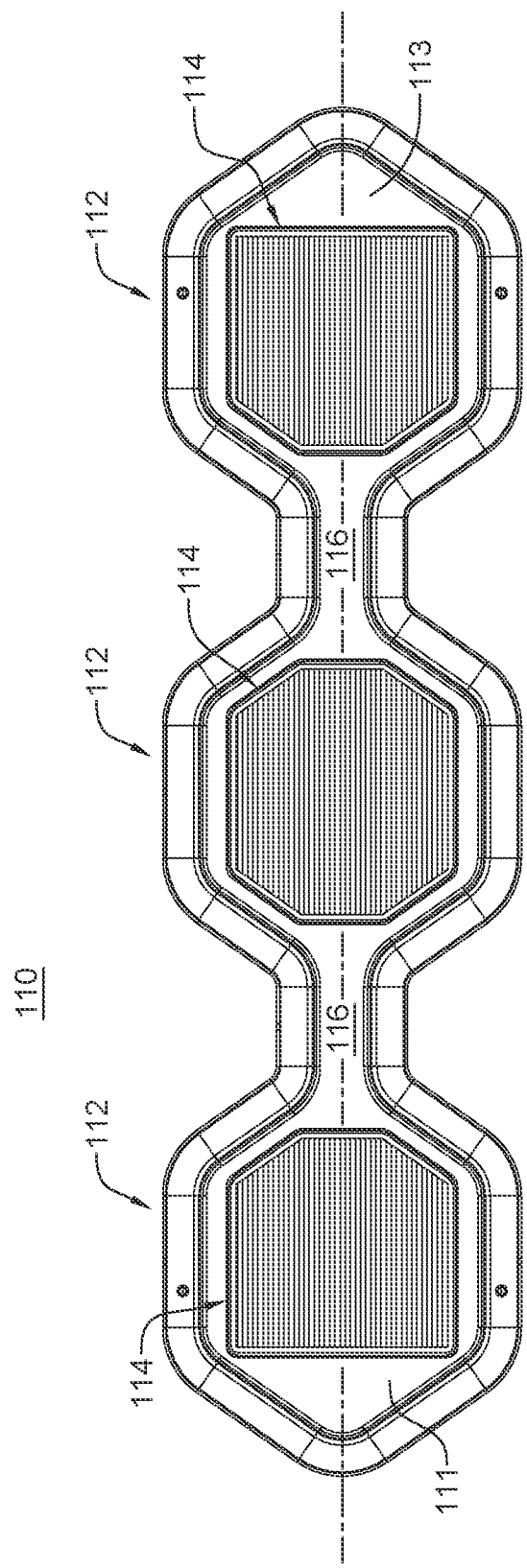
FIG. 2B is a cross-sectional plan view of one embodiment of the flexible cold plate of FIG. 2A, taken along line 2B-2B thereof, that is to be fabricated in accordance with one or more aspects of the present invention.

FIG. 2B depicts a cross-sectional plan view of one embodiment of the flexible liquid-cooled cold plate 110 of FIG. 2A, taken along line 2B-2B thereof. In this embodiment, the heat transfer elements 114 in active regions 112 are depicted as finsinks (by way of example only), which include cooling fins. If desired, the finsinks and/or cooling fins may have different lengths in the different active regions 112. More generally, heat transfer elements 114, may have any desired position, configuration, and/or size to facilitate cooling of a respective heat-generating electronic component of an electronic assembly to which the cold plate is to operatively attach for removal of heat. For instance, if one of the electronic components produces a greater amount of heat or is physically larger, then the active region 112 over that particular electronic component may be differently configured (e.g., be larger) than the active regions over the other electronic components to which the cold plate is coupled.

As depicted in FIG. 2B, intermediate regions 116 of reduced height in the example of FIG. 2A may also have a reduced width, which further facilitates flexibility of the liquid-cooled cold plate 110 when positioned in place over the electronic assembly with the multiple heat-generating electronic components to be cooled, such as shown in FIG. 1. Note also that the exemplary embodiment of FIGS. 1-2B, with three electronic components to be cooled and three active regions in the cold plate, is provided by way of example only. Any number of active regions, including one, two, three, or more, may be defined within a flexible, liquid-cooled cold plate (to be fabricated as described herein), to cool any number of electronic components of an electronic assembly.

Figure 3:
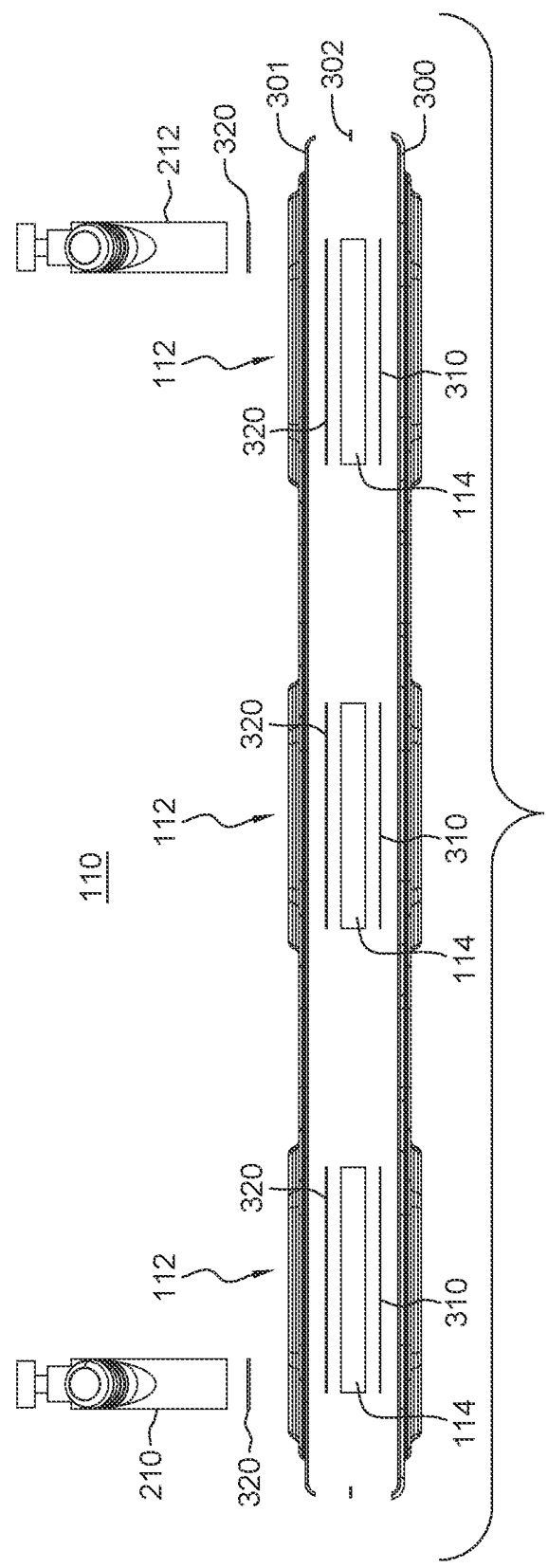
FIG. 3 is an exploded view of one embodiment of a flexible cold plate such as depicted in FIGS. 1-2B to be fabricated using a fixture and fabrication process, in accordance with one or more aspects of the present invention.

FIG. 3 depicts an exploded view of one embodiment of liquid-cooled cold plate 110, such as depicted in FIGS. 1-2B. In FIG. 3, liquid-cooled cold plate 110 is shown unassembled and includes, in one or more implementations, a lower section or shell 300 and an upper section or shell 301 to be bonded together using, for instance, a braze or solder material 302 along the periphery, where lower section 300 and upper section 301 physically contact. Further, in this embodiment, a first joining material 310, such as a first braze or solder material, may be provided between the respective heat transfer element 114 and lower section 300 of liquid-cooled cold plate 110, and a second joining material, such as a second braze or solder material 320 may be provided above heat transfer elements 114 to physically attach each heat transfer element 114 to upper section 301 of liquid-cooled cold plate 110. Additionally, raised coolant inlet coupling 210 and raised coolant outlet coupling 212 may be metallurgically joined to upper section 301 of liquid-cooled cold plate 110 using, for instance, second joining material 320. In one or more implementations, the raised coolant inlet and outlet couplings 210, 212 are joined at respective openings in upper section 301 to allow for coolant to flow through the liquid-cooled cold plate via the couplings. By way of example, the first joining material 310 and the second joining material 320 may be different joining materials, such as different braze or solder materials, or may be the same joining materials. In one or more embodiments, first joining material 310 may be a sheet of braze or solder material placed in between a respective heat transfer element 114 and lower section 300 of liquid-cooled cold plate 110 prior to heat treatment of the cold plate to metallurgically bond the thermally conductive components together.

In operation, the first joining material 310 will be of greater significance in terms of the performance of liquid-cooled cold plate 110 than the second joining material 320, since the first joining material is in the thermal conduction path from the respective heat-generating electronic component (see FIG. 1) when the liquid-cooled cold plate 110 is operatively positioned above and in contact with the electronic assembly. In order to provide good thermal conduction across a braze or solder interface between heat transfer element 114 and lower section 300 of liquid-cooled cold plate 110, the percent of brazing or soldering voids between the heat transfer element and the lower section needs to be minimized, or even eliminated. This issue can be significant since if too great a void area exists at the bond, or interface, then efficiency of the cold plate is reduced, and since there is no feasible rework of such a liquid-cooled cold plate once fabricated, the cold plate would need to be discarded.

In one or more embodiments, since the liquid-cooled cold plate 110 of FIGS. 1-3 is of a flexible design, such as described herein, brazing the individual active regions 112 to achieve uniformity between the metallurgical interfaces coupling the heat transfer elements 114 and the lower section 300 in the respective active regions may be a significant issue, which is advantageously addressed using a fixture and fabrication process such as disclosed herein below with reference to FIGS. 4A-8B.

Figure 4A:
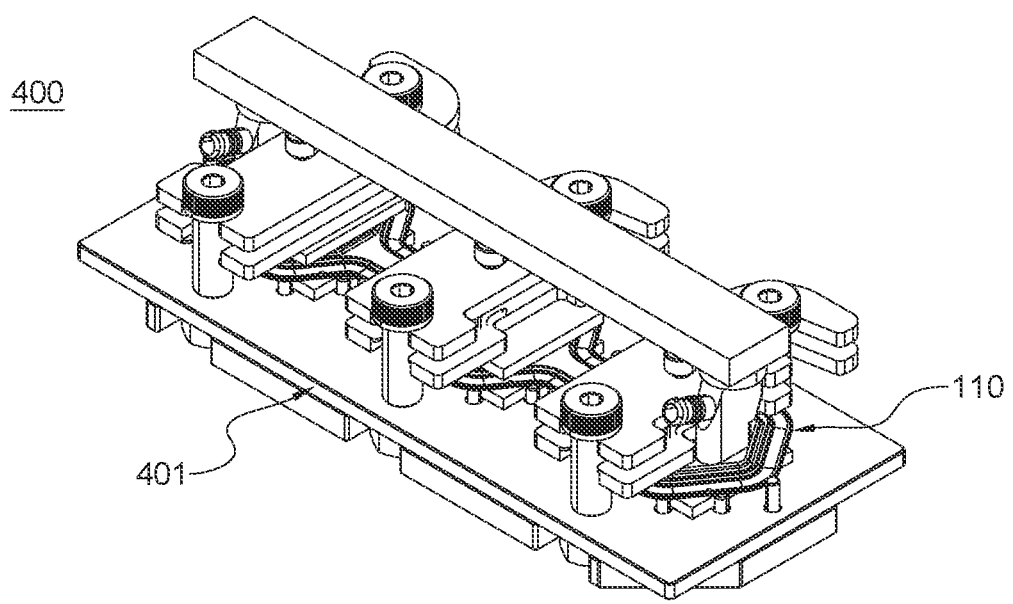
FIG. 4A depicts one embodiment of an assembled flexible cold plate within a fixture to facilitate bonding the flexible cold plate together, in accordance with one or more aspects of the present invention.

FIG. 4A depicts one embodiment of a fixture and cold plate assembly, generally denoted 400, in accordance with one or more aspects of the present invention. As depicted, the fixture and cold plate portions of assembly 400 are ready to run through a furnace for heat treatment to metallurgically join the sections, and the couplings to the upper section, and heat transfer elements to the lower section of the flexible, liquid-cooled cold plate 110. FIG. 4B depicts an exploded view of the fixture and cold plate assembly 400 of FIG. 4A, illustrating components of the fixture 401 (FIG. 4A), in accordance with one or more aspects of the present invention.

As shown in FIG. 4B, in one or more implementations, the assembly may include a registration plate 410 with alignment features, such as openings 411 and alignment pins 412 to facilitate placement of a base plate 415 of the fixture onto registration plate 410, as well as alignment of registration pins 420 relative to registration plate 410. In one embodiment, registration pins 420, which are static load registration pins, may be bolts that are threadedly secured in position relative to registration plate 410 and base plate 415 using mating nuts 421. Further, the static load registration pins include respective registration pin heads 422.

Carbon blocks 430, 431 may be used above and below liquid-cooled cold plate 110, for instance, above and below the active regions of the cold plate to provide anti-stick surfaces above and below the active regions of the liquid-cooled cold plate 110. By way of example only, the fixture components, such as base plate 415 and platens 440 (discussed below), may be made of stainless steel, while the outer liquid-cooled cold plate sections could be, for instance, copper. Also, note that although shown assembled in FIG. 4B, liquid-cooled cold plate 110 may be assembled (in one or more embodiments) within the fixture in a manner such as described above in connection with FIG. 3, and below with reference to FIGS. 8A & 8B. For instance, joining materials may be disposed internally between the respective components of the liquid-cooled cold plate. The joining materials, such as the first and second joining materials at the lower and upper surfaces of the heat transfer elements within the active regions may be provided as, for instance, sheets of material (such as sheets of braze or solder material). Additionally, joining material may be provided along the periphery where the lower and upper sections of the liquid-cooled cold plate contact, as well as beneath the raised couplings which are to be joined to the upper section of the liquid-cooled cold plate at the respective coolant inlet and outlet openings formed in the upper section.

As further shown in FIG. 4B, the fixture includes multiple platens 440 which, in the embodiment depicted, are identically configured to have a first slip fit region 441 (e.g., opening, recess, etc.) and a second slip fit region 442 (e.g., opening, recess, etc.) positioned and sized to facilitate slip fitting the platen around a respective pair of registration pins 420 as the fixture is being assembled. The fixture also includes multiple load plates 450 which, in the embodiment depicted, are also identically configured, and a first slip fit region 451 and a second slip fit region 452 sized and shaped to facilitate slip fitting each load plate around its corresponding registration pins, which may be the same or different registration pins from the respective platen. In the embodiment depicted, a load plate 450 slip fits around the same registration pins as a respective platen 440. Each load plate includes a single load pin 455, which is a dynamic load pin that is centrally disposed in the load plate 450 to facilitate applying a uniform load to the respective platen 440, or more generally, to the respective fixture stack segment including the underlying platen 440 and a respective active region of cold plate 110.

The raised coolant inlet coupling 210 and coolant outlet coupling 212 have pre-formed joining material disposed between the couplings and the upper section of liquid-cooled cold plate 110 and, in one or more embodiments, carbon circles or rings 461 may be placed on top of the raised inlet and outlet couplings 210, 212, with the carbon circles 461 being configured to mate with an alignment outrigger 460, for instance, with respective bores in the alignment outrigger 460. Alignment outrigger is configured to hold the raised inlet and outlet couplings 210, 212, in position during heat treatment of the assembly to facilitate fabricating the liquid-cooled cold plate.

Figure 5:
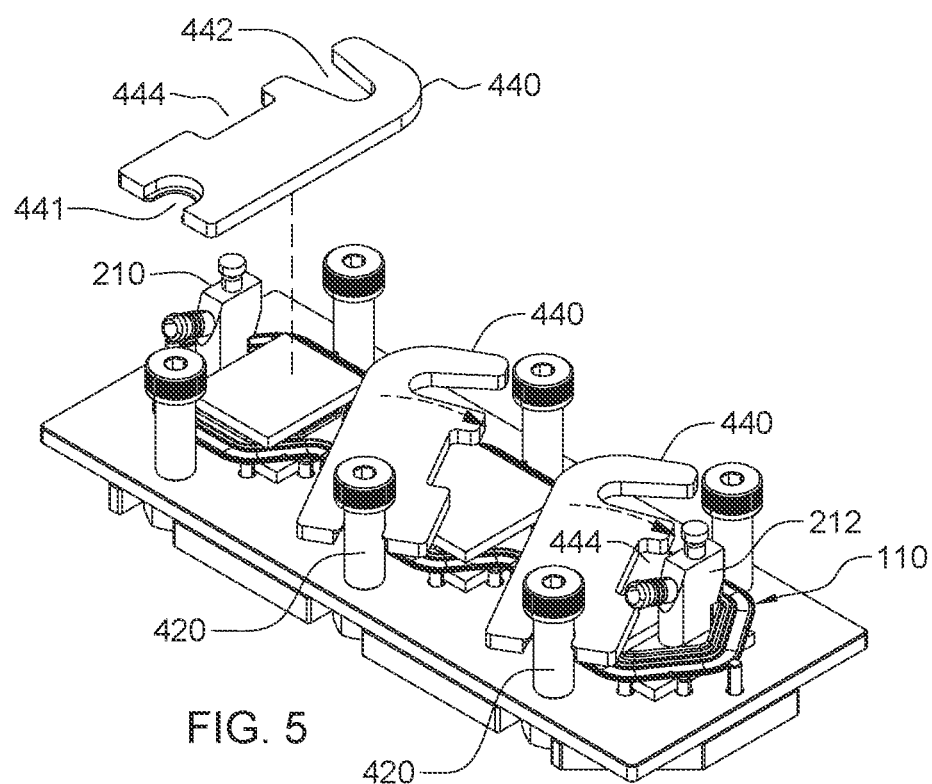
FIG. 5 illustrates a partially assembled fixture such as depicted in FIGS. 4A & 4B, with the platens being shown slip fit in position around respective registration pins over corresponding active regions of the cold plate, and forming respective fixture stack segments, in accordance with one or more aspects of the present invention.
Figure 6:
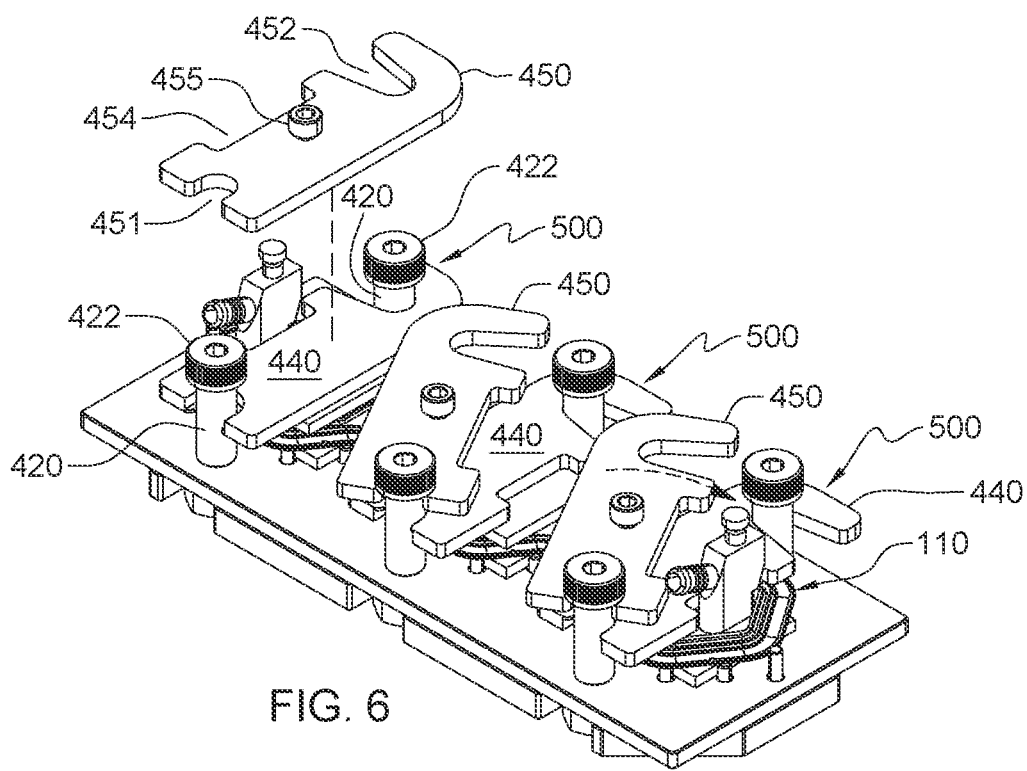
FIG. 6 depicts the fixture and flexible cold plate assembly of FIG. 5 with the load plates shown being slip fit in position over respective fixture stack segments of the assembly, in accordance with one or more aspects of the present invention.
Figure 7:
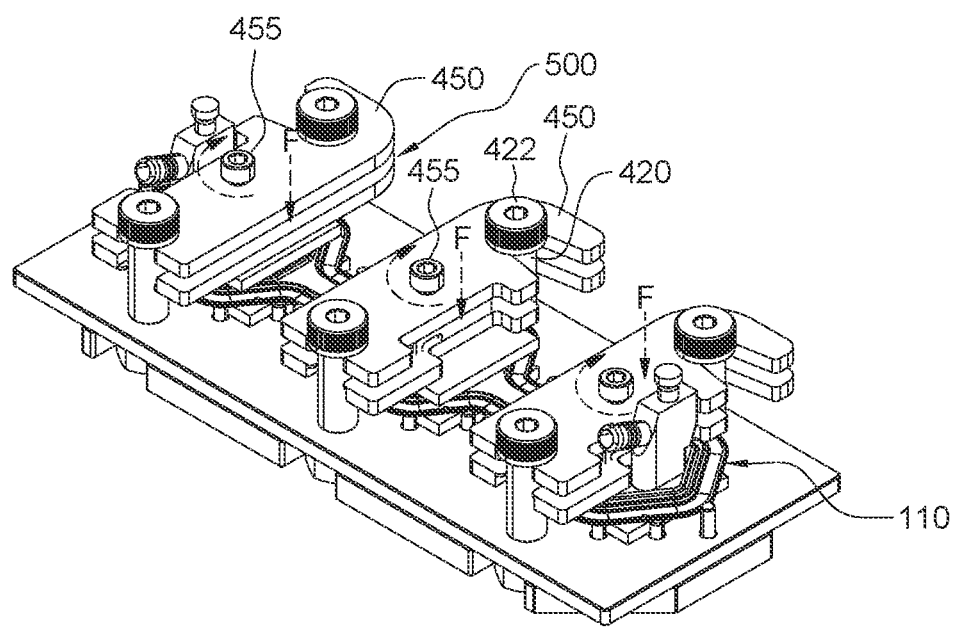
FIG. 7 depicts the fixture and cold plate assembly of FIGS. 4A-6 with the load pins shown being torqued to apply a load force 'F' to the platens, and thereby to the cold plate in the respective active regions of the cold plate, in accordance with one or more aspects of the present invention.

By way of further example, FIGS. 5-7 illustrate assembly of the fixture about the cold plate at different stages. In FIG. 5, the fixture is shown with the liquid-cooled cold plate 110 positioned as described above relative to the base plate, and including carbon blocks above and below the active regions of the liquid-cooled cold plate. In FIG. 5, the platens 440 are shown being slip fit into place about their respective registration pins 420. In particular, the first slip fit regions 441 in platens 440 are slip fit into the corresponding registration pin on one side of the base plate, and the second slip fit regions 442 in platens 440 are slid in a rotating manner to slip fit about the corresponding registration pins 420 on the other side of the base plate. As noted above, in one or more implementations, each platen may have an identical configuration (as one example only). The platens 440 include a further opening or recess 444 which is positioned to allow the end positioned platens to wrap around the corresponding raised coolant inlet or coolant outlet coupling when the platen is positioned adjacent to the coupling.

In FIG. 6, load plates 450 are shown being slip fit in place around their corresponding registration pins 420 above respective fixture stack segments 500 and overlying a respective platen 440. In the embodiment illustrated, each load plate 450 therefore overlies a respective active region of liquid-cooled cold plate 110. As with platens 440, first slip fit regions 451 in load plate 450 slip fit about corresponding registration pins 420 on one side of the base plate, and second slip fit regions 452 in each load plate 450 slip fit (for instance, by rotating the load plate in position) about a respective registration pin 420 on the other side of the base plate. As illustrated, each registration pin head 422 overlies a portion of the respective load plate 450, and serves as a stop against which the load plate rests when load pins 455 are torqued to apply a load to the respective fixture stack segment 500. As with platens 440, a further opening or recess 454 may be provided in at least the end positioned load plates 450 to wrap around the respective raised inlet and outlet couplings of liquid-cooled cold plate 110. Note in this regard that the load plates being identically configured, as well as the load plates being identically configured to the platens are provided herein by way of example only.

FIG. 7 depicts the assembly of FIG. 6 with the load pins 455 (for instance, load screws) being torqued, in one or more implementations, a set amount in order to apply a uniform force 'F' in a downward direction onto the respective fixture stack segment 500 aligned to a respective active region of the liquid-cooled cold plate 110. The resultant uniform force is selected to provide a good metallurgical bonding of the heat transfer elements within the active regions of the liquid-cooled cold plate 110 to the base section or shell of the cold plate during heat treatment in, for instance, a braze furnace.

Figure 8A:
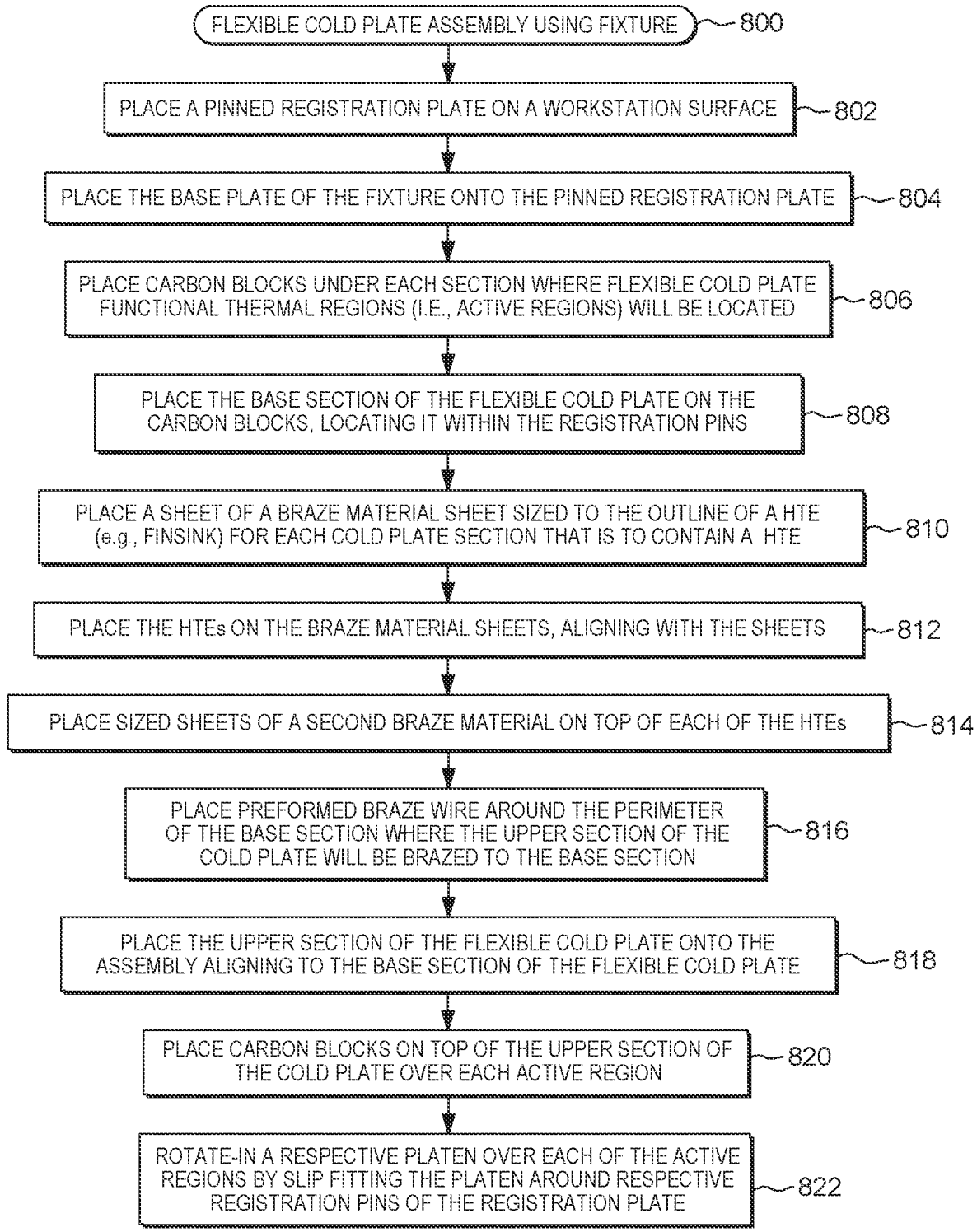
FIGS. 8A & 8B depict one embodiment of a process for fabricating a flexible cold plate using a fixture such as depicted in FIGS. 4A-7, in accordance with one or more aspects of the present invention.
Figure 8B:
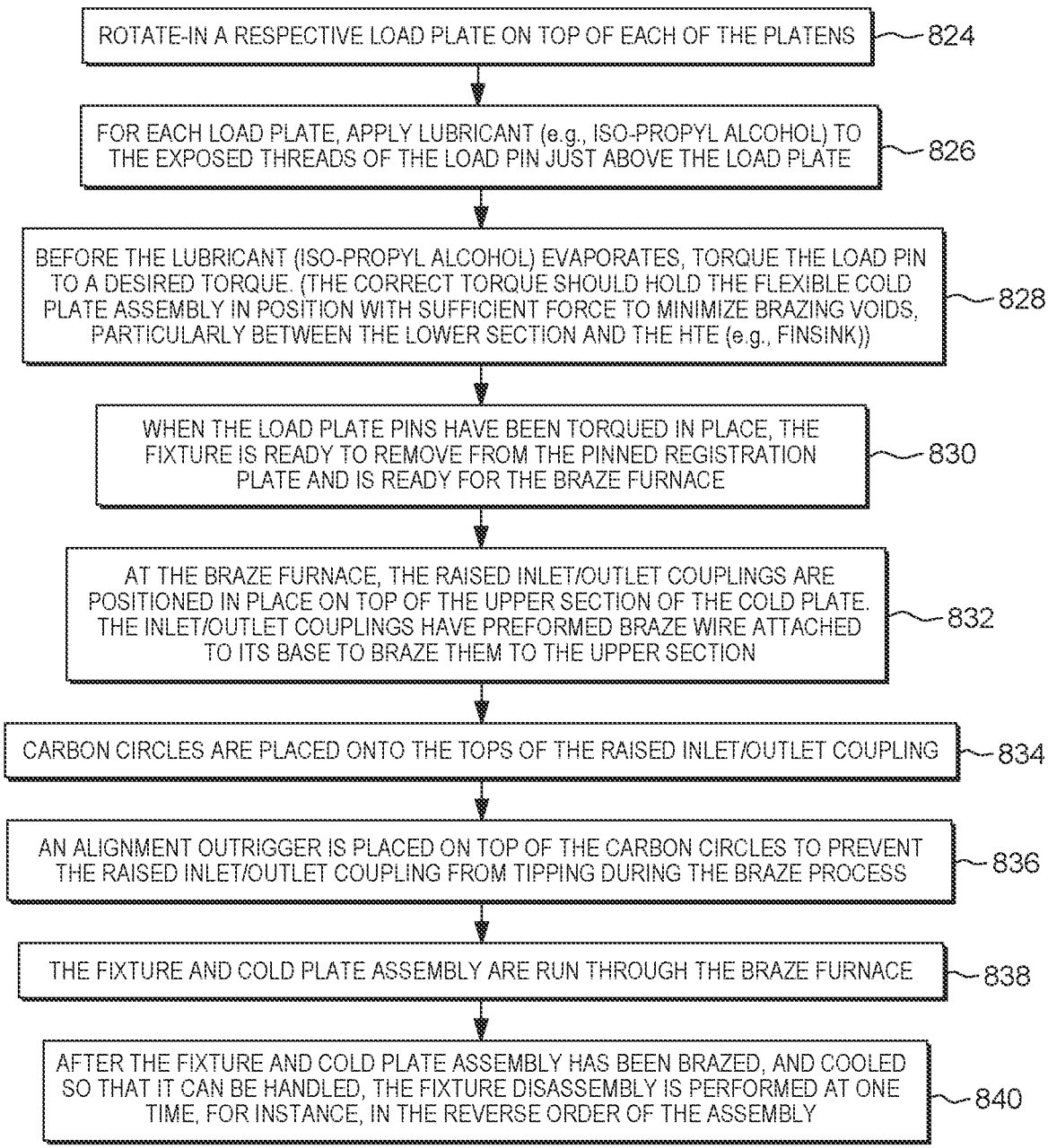

By way of further explanation, FIGS. 8A & 8B depict one embodiment of a process for fabricating a liquid-cooled cold plate using a fixture such as described herein above. As shown, the fixture-based, cold plate assembly process 800 may include placing a pinned registration plate on a workstation surface 802, and placing the base plate of the fixture onto the pinned registration plate 804. Carbon blocks are placed on the base plate and positioned to align to the active regions of the cold plate to be fabricated 806. The base shell or section of the cold plate is then placed on the carbon blocks, locating the base section within the registration pins 808. A sheet of joining material, such as a sheet of braze or solder material, sized to the outline of each heat transfer element (e.g., finsink) for each cold plate active region is placed onto the lower section of the cold plate 810. The heat transfer elements (e.g., finsinks) are then placed on the joining material sheets, and aligned with the sheets 812. Appropriately sized sheets of a second joining material may be placed on top of each of the heat transfer elements 814. By way of specific example, the first joining material may be a braze material, such as BAg8, and the second joining material may be a second braze material, such as BCuP5. Alternatively, other joining materials could be used, and note that, in one or more implementations, the first and second joining materials may be the same material. Also, a pre-formed braze wire may be placed around the perimeter of the lower section (or shell) where the upper section (or shell) of the cold plate is to be brazed to the lower section 816. The upper section of the flexible cold plate is then placed onto the assembly, aligning to the lower section of the cold plate. Carbon blocks may be placed on top of the upper section of the cold plate over each active region of the cold plate 820. A respective platen may then slid in place over each of the active regions by slip fitting the platen around respective registration pins of the registration plate 822.

Continuing with FIG. 8B, a respective load plate is slid in place on top of each of the platens 824. For each load plate, lubricant, such as isopropyl alcohol (IPA) may be applied to the exposed threads of the load pin just above the load plate 826. Before the lubricant evaporates, the load pin may be torqued to a desired torque 828. Note that the correct torque should hold the flexible cold plate assembly in position with sufficient force to minimize joining or brazing voids, particularly between the lower section and the respective heat transfer element (e.g., finsink). When the load plate pins have been torqued in place, the fixture is ready to be removed from the pin registration plate, and placed in a furnace 830. At the furnace, the inlet/outlet couplings may be positioned in place on top of the upper section of the cold plate 832. The inlet/outlet couplings may have pre-formed braze or solder wire attached to their base to braze or solder the respective coupling to the upper section. In one or more implementations, carbon circles or rings may be placed onto the tops of the raised inlet/outlet couplings 834, and an alignment outrigger may be positioned on top of the carbon circles to prevent the raised inlet/outlet couplings from moving during the braze or solder process 836. The fixture and cold plate assembly is then run through the furnace at an appropriate temperature 838. Note that the furnace employed could be any type of furnace, for instance, a belt furnace, or a vacuum furnace. After the fixture and cold plate assembly have undergone brazing, and cooled so that the fixture can be handled, fixture disassembly may be performed at one time, for instance, in a reverse order of the assembly process 840.

Those skilled in the art will note from the description provided herein that numerous advantages are provided by the fixture and fabrication process set forth. For instance, the fixture and heat sink (or cold plate) to be fabricated may be assembled quickly, for example, in a matter of seconds, using components that slip fit in place. In particular, slip on and slip off platens and load plates are provided. The platens and the load plates include anti-bind features or slip fit regions that allow the platens and load plates to be readily slipped in place. A uniform load is applied by using a single load pin or screw per load plate, and thus per fixture stack segment (i.e., per active region of the flexible cold plate). No torque sequencing is required in that a single screw applies the desired force or load to each segment. If desired, lubricant can be added to the load pin to prevent galling. By way of example, isopropyl alcohol lubricant could be used, which evaporates shortly after application. Alternatively, stearic acid, decarboxylates, between 248-290° C., with a peak braze temperature, in one or more embodiments, of 820° C. In particular: $CH_3(CH_2)_{16}COOH \Rightarrow CO_2 + CH_3(CH_2)_{15}CH_3$ As a further enhancement, the cross-heads or the load pins may be made of Molybdenum to prevent galling. The single point center loading approach disclosed herein provides significant advantages in terms of uniformity of the resultant metal joined interface across which heat is transferred from, for instance, the respective electronic component to the heat transfer element of the heat sink.

To summarize, disclosed herein, in one or more implementations, is a fixture to facilitate fabrication of a heat sink which includes a lower section and at least one heat transfer element. The fixture includes a base plate to support the lower section of the heat sink, and multiple registration pins extending from (e.g., protruding through) the base plate. Further, the fixture includes at least one platen to reside above the at least one heat transfer element of the heat sink, and a platen of the at least one platen includes slip fit regions configured to slip fit around respective registration pins of the multiple registration pins with the lower section and a respective heat transfer element disposed between the base plate and the platen, and forming a fixture stack segment aligned with an active region of the heat sink to cool a heat-generating electronic component. The fixture also includes at least one load plate. A load plate of the at least one load plate includes slip fit regions configured to slip fit around corresponding registration pins of the multiple registration pins with the load plate disposed over the fixture stack segment, above the platen of the at least one platen, and the load plate including a single load pin. The single load pin is disposed, for instance, centrally in the load plate to contact the platen and facilitate applying a load to the fixture stack segment to assisting bonding (e.g., metallurgically bonding, brazing, soldering, etc.) the respective heat transfer element and the lower section of the heat sink together.

In one or more embodiments, a first slip fit region and a second slip fit region of the slip fit regions in the platen of the at least one platen are differently configured to facilitate slip fitting the platen about the respective registration pins of the multiple registration pins. Further, in one or more implementations, a first slip fit region and a second slip fit region of the slip fit regions in the load plate of the at least one load plate are differently configured to facilitate slip fitting the load plate around the corresponding registration pins of the multiple registration pins.

In one or more embodiments, the platen of the at least one platen, and the load plate of the at least one load plate, are identically configured, and for instance, the platen and the load plate slip fit around the same registration pins of the multiple registration pins. In certain embodiments, the single load pin is a single load screw which is tightened or torqued to apply the load to the platen, and hence to the respective fixture stack segment aligned with the active region of the heat sink.

In one or more implementations, the heat sink includes multiple heat transfer elements, the at least one heat transfer element being at least one heat transfer element of the multiple heat transfer elements, and the lower section of the heat sink is a lower shell of the heat sink. The heat sink may also include an upper shell, and the at least one heat transfer element is to be brazed or soldered to the lower shell and to the upper shell. In one or more embodiments, the heat transfer element includes a finsink through which liquid coolant is to flow, and the load applied to the fixture stack segment facilitates brazing or soldering the finsink to the lower shell of the active region of the finsink. The load applied to the fixture stack segment may further facilitate brazing or soldering the finsink to the upper shell in the active region of the heat sink. In one or more implementations, the heat sink further includes a raised coolant inlet coupling extending from the upper shell, and a raised coolant outlet coupling extending from the upper shell, and the fixture further includes an alignment outrigger coupled to the raised coolant inlet and outlet couplings to facilitate holding the raised coolant inlet and outlet couplings in position during thermal treatment of the heat sink.

Further, in one or more implementations, a fixture facilitates fabrication of a cold plate with multiple heat transfer elements is provided herein. The fixture includes a base plate to support a lower section of the cold plate, the cold plate including multiple active regions, with each active region including a respective heat transfer element to facilitate cooling a respective heat generating electronic component. The fixture also includes multiple registration pins extending out relative to the base plate, and multiple platens to reside above an upper section of the cold plate. A platen of the multiple platens includes slip fit regions configured to slip fit around respective registration pins of the multiple registration pins with the lower section and the upper section of the cold plate disposed between the base plate and the platen, and forming a fixture stack segment aligned with a heat transfer element in a respective active region of the multiple active regions of the cold plate. Further, the fixture includes multiple load plates. A load plate of the multiple load plates includes slip fit regions configured to slip fit around corresponding registration pins of the multiple registration pins with the load plate disposed over the fixture stack segment, above the platen of the multiple platens, and the load plate includes a single load pin. The single load pin of the load plate may be centrally disposed in the load plate to facilitate applying a load to the fixture stack segment to facilitate bonding the lower section, the respective heat transfer element, and the upper section of the cold plate together.

In one or more implementations, the fixture facilitates uniformly brazing or soldering the multiple heat transfer elements to the lower section in the multiple active regions thereof. In one or more embodiments, the multiple heat transfer elements may include multiple finsinks, with each finsink to be brazed or soldered to the lower section in a respective active region of the cold plate. In certain embodiments, the slip fit regions in the platen of the multiple platens may be differently configured to facilitate slip fitting the platen around the respective registration pins of the multiple registration pins. Similarly, the slip fit regions in the load plate of the multiple load plates may be differently configured to facilitate slip fitting the load plate around the corresponding registration pins of the multiple registration pins. In one or more implementations, the registration pins around which the load plate is slip fit may include registration pin heads against which the load plate rests when the single load pin is applying the load to the fixture stack segment.

In one or more further embodiments, a method of facilitating fabrication of a heat sink comprising a lower section and at least one heat transfer element is provided. The method includes providing a fixture, where providing the fixture includes: providing a base plate to support the lower section of the heat sink; providing multiple registration pins extending out from the base plate; providing at least one platen to reside above the at least one heat transfer element of the heat sink, a platen of the at least one platen including slip fit regions configured to slip fit around respective registration pins of the multiple registration pins with the lower section and a respective heat transfer element of the at least one heat transfer element of the heat sink disposed between the base plate and the platen, and forming a fixture stack segment aligned with an active region of the heat sink to cool a heat-generating electronic component; and providing at least one load plate, a load plate of the at least one load plate including slip fit regions configured to slip fit around corresponding registration pins with the load plate disposed over the fixture stack segment, above the platen of the at least one platen and the load plate including a single load pin, the single load pin being disposed in the load plate to contact the platen and facilitate applying a load to the fixture stack segment to facilitate bonding the respective heat transfer element and the lower section of the heat sink together.

In one or more embodiments, the heat sink is a cold plate, which further includes an upper section. Also, the method may further include using the fixture to facilitate fabricating the cold plate. The using may include: placing the lower section of the cold plate onto the base plate, locating the lower section relative to the multiple registration pins; placing the respective heat transfer element on the lower section in the active region of the cold plate configured for cooling the respective heat-generating electronic component, with a braze or solder material disposed between the heat transfer element and the lower section; placing the upper section of the cold plate onto the lower section with the heat transfer element in the active region disposed between the lower and upper sections; placing the platen of the at least one platen around the respective registration pins to form the fixture stack segment; placing the load plate of the at least one load plate around the corresponding registration pins of the multiple registration pins over the fixture stack segment, and above the platen of the at least one platen; and applying a torque to the single load pin in the load plate to apply the load to the fixture stack segment to facilitate brazing or soldering of the cold plate, including brazing or soldering of the lower section and the heat transfer element together via the braze or solder material therebetween.

In a further aspect, the braze or solder material is a first joining material, and the method further includes providing a second joining material between the heat transfer element and the upper section of the cold plate in the active region of the cold plate, and between the upper section and the lower section to facilitate bonding the heat transfer element to the upper section, and facilitate bonding the upper and lower section together simultaneous with bonding of the heat transfer element to the lower section. In one or more embodiments, the first joining material and the second joining material are different braze materials. Further, in one or more embodiments, the heat transfer element may be a finsink. Additionally, in one or more implementations, the method may include applying a lubricant to the load pin prior to the applying of the torque, the lubricant comprising isopropyl alcohol or stearic acid.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A fixture to facilitate fabrication of a cold plate with multiple heat transfer elements, the fixture comprising:
   a base plate to support a lower section of the cold plate, the cold plate comprising multiple active regions, each active region including a respective heat transfer element to facilitate cooling a respective heat-generating electronic component;
   multiple registration pins extending from the base plate;
   multiple platens to reside above an upper section of the cold plate, a platen of the multiple platens including outer perimeter recesses that define perimeter slip fit regions which facilitate slip fit of the platen around respective registration pins of the multiple registration pins with the respective registration pins passing through the outer perimeter recesses in the platen and the lower section and upper section of the cold plate disposed between the base plate and the platen, and forming a fixture stack segment aligned with a heat transfer element in a respective active region of the multiple active regions of the cold plate; and
   multiple load plates, a load plate of the multiple load plates including outer perimeter recesses that define perimeter slip fit regions which facilitate slip fit of the load plate around corresponding registration pins of the multiple registration pins with the corresponding registration pins passing through the outer perimeter recesses in the load plate and the load plate disposed over the fixture stack segment, above the platen of the multiple platens, and the load plate including a single load pin, the single load pin of the load plate extending through the load plate and pressing against the platen to facilitate applying a load to the fixture stack segment to facilitate bonding the lower section, the respective heat transfer element and upper section of the cold plate together.

2. The fixture of claim 1, wherein the fixture facilitates applying a uniform load to the fixture stack segment to facilitate brazing or soldering the multiple heat transfer elements to the lower section in the multiple active regions thereof.

3. The fixture of claim 2, wherein the multiple heat transfer elements comprise multiple cooling structures through which liquid coolant is to flow, each cooling structure to be brazed or soldered to the lower section in a respective active region of the cold plate.

4. The fixture of claim 1, wherein the slip fit regions in the platen of the multiple platens are differently-shaped outer perimeter recesses in the platen to facilitate slip fitting the platen around the respective registration pins of the multiple registration pins.

5. The fixture of claim 1, wherein the slip fit regions in the load plate of the multiple load plates are differently-shaped outer perimeter recesses in the load platen to facilitate slip fitting the load plate around the corresponding registration pins of the multiple registration pins.

6. The fixture of claim 1, wherein the corresponding registration pins around which the load plate is slip fit include registration pin heads against which the load plate rests when the single load pin is applying the load to the fixture stack segment.

7. The fixture of claim 1, wherein the platen of the multiple platens and the load plate of the multiple load plates are identically configured, and wherein the platen and the load plate slip fit around the same registration pins of the multiple registration pins.

8. The fixture of claim 1, wherein the single load pin is a single load screw disposed centrally in the load plate.

9. The fixture of claim 1, wherein the respective heat transfer element comprises a cooling structure through which liquid coolant is to flow.

10. The fixture of claim 9, wherein the heat sink further comprises a raised coolant inlet coupling extending from the upper shell and a raised coolant outlet coupling extending from the upper shell, and wherein the fixture further comprises an alignment outrigger coupled to the raised coolant inlet and outlet couplings to facilitate holding the raised coolant inlet and outlet couplings in position during thermal treatment of the heat sink.

11. A method of facilitating fabrication of a cold plate with multiple heat transfer elements, the method comprising:
   assembling a fixture comprising:
      providing a base plate to support a lower section of the cold plate, the cold plate comprising multiple active regions, each active region including a respective heat transfer element to facilitate cooling a respective heat-generating electronic component;
      positioning multiple registration pins to extend from the base plate;
      slip fitting multiple platens above an upper section of the cold plate, a platen of the multiple platens including outer perimeter recesses that define perimeter slip fit regions which facilitate slip fit of the platen around respective registration pins of the multiple registration pins, with the respective registration pins passing through the outer perimeter recesses in the platen and the lower section and the upper section of the cold plate disposed between the base plate and the platen, and forming a fixture stack aligned with a heat transfer element in a respective active region of the multiple active regions of the cold plate; and
      slip fitting multiple load plates, a load plate of the multiple load plates including outer perimeter recesses that define perimeter slip fit regions which facilitate flip fit of the load plate around corresponding registration pins of the multiple registration pins, with the corresponding registration pins passing through the outer perimeter recesses in the load plate and the load plate disposed over the fixture stack segment, above the platen of the multiple platens, and the load plate including a single load pin, the single load pin of the load plate extending through the load plate pressing against the platen to facilitate applying a load to the fixture stack segment to facilitate bonding the lower section, the respective heat transfer element and the upper section of the cold plate together.

12. The method of claim 11, wherein the cold plate further comprises an upper section, and wherein the method comprises using the fixture to facilitate fabricating the cold plate, the using comprising:

placing the lower section of the cold plate onto the base plate, locating the lower section relative to the multiple registration pins;

placing the respective heat transfer element on the lower section of the active region of the cold plate configured for cooling the respective heat-generating electronic component, with a braze or solder material disposed between the heat transfer element and the lower section;

placing the upper section of the cold plate onto the lower section of the heat transfer element in the active region disposed between the lower plate and the upper sections;

slip fitting the platen of the multiple platens around the respective registration pins to form the fixture stack segment;

slip fitting the load plate of the multiple load plates around the corresponding registration pins of the multiple registration pins over the fixture stack segment, and above the platen of the multiple platens; and applying a torque to the single load pin in the load plate to apply the load to the fixture stack segment to facilitate brazing or soldering of the cold plate, including brazing or soldering of the lower section and the heat transfer element together using the braze or solder material disposed therebetween.

13. The method of claim 12, wherein the braze or solder material is a first joining material, and wherein the method further comprises providing a second joining material between the heat transfer element and the upper section of the cold plate in the active region of the cold plate, and between the upper section and the lower section to facilitate bonding the heat transfer element to the upper section, and facilitate bonding the upper and lower sections together simultaneously with bonding of the heat transfer element to the lower section.

14. The method of claim 13, wherein the first joining material and the second joining material are different braze materials.

15. The method of claim 13, wherein the heat transfer element comprises a cooling structure through which liquid coolant is to flow, the cooling structure including a plurality of fins.

16. The method of claim 15, further comprising applying a lubricant to the load pin prior to applying the torque, the lubricant comprising isopropyl alcohol or stearic acid.

* * * * *